United States Patent
Muhammad et al.

(10) Patent No.: US 7,791,407 B2
(45) Date of Patent: *Sep. 7, 2010

(54) TECHNIQUE FOR IMPROVING ANTIALIASING AND ADJACENT CHANNEL INTERFERENCE FILTERING USING CASCADED PASSIVE IIR FILTER STAGES COMBINED WITH DIRECT SAMPLING AND MIXING

(75) Inventors: Khurram Muhammad, Richardson, TX (US); Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/388,558

(22) Filed: Mar. 24, 2006

(65) Prior Publication Data

US 2006/0164160 A1    Jul. 27, 2006

Related U.S. Application Data

(63) Continuation of application No. 10/712,593, filed on Nov. 13, 2003, now Pat. No. 7,411,444.

(51) Int. Cl.
*H03K 5/00* (2006.01)

(52) U.S. Cl. ............... 327/552; 327/337; 708/331
(58) Field of Classification Search ......... 327/551–559, 327/94, 337; 708/331
See application file for complete search history.

(56) References Cited

U.S. PATENT DOCUMENTS

| | | | | |
|---|---|---|---|---|
| 4,972,356 A | * | 11/1990 | Williams | ........... 708/313 |
| 5,140,325 A | | 8/1992 | Yu et al. | |
| 5,212,659 A | | 5/1993 | Scott et al. | |
| 5,372,046 A | * | 12/1994 | Kleven et al. | ........... 73/861.22 |
| 5,390,364 A | * | 2/1995 | Webster et al. | ........... 455/506 |
| 5,732,002 A | | 3/1998 | Lee et al. | |
| 6,181,740 B1 | | 1/2001 | Yasuda | |
| 6,414,541 B1 | * | 7/2002 | Arvidsson et al. | ........... 327/554 |

FOREIGN PATENT DOCUMENTS

| | | | |
|---|---|---|---|
| GB | 2230627 A | | 8/1989 |
| JP | 362264712 | * | 11/1987 |

* cited by examiner

*Primary Examiner*—Dinh T. Le
(74) *Attorney, Agent, or Firm*—Ronald O. Neerings; Wade James Brady, III; Frederick J. Telecky, Jr.

(57) ABSTRACT

A technique of improving antialiasing and adjacent channel interference filtering uses cascaded passive IIR filter stages combined with direct sampling and mixing. The methodology and related architecture allows for increased passive IIR filtering without necessitating use of amplifier stages.

16 Claims, 8 Drawing Sheets

TECHNIQUE FOR IMPROVING ANTIALIASING AND ADJACENT CHANNEL INTERFERENCE FILTERING USING CASCADED PASSIVE IIR FILTER STAGES COMBINED WITH DIRECT SAMPLING AND MIXING

This application is a Continuation of application Ser. No. 10/712,593, filed Nov. 13, 2003 now U.S. Pat. No. 7,411,444.

BACKGROUND OF THE INVENTION

1. Field of the Invention

This invention relates generally to discrete time radio frequency (RF) filtering, and more particularly to a method of improving antialiasing and adjacent channel interference filtering suitable for GSM (global system for mobile communications) applications, among others.

2. Description of the Prior Art

Discrete-time radio frequency (RF) is still a newly emerging field in wireless digital communications wherein analog RF signals that are transmitted over-the-air are directly sampled into a discrete-time sample stream suitable for digital signal processing. A typical wireless digital communications device would use analog filters, duplexers, mixers, analog-to-digital converters (ADC), and the like to convert the analog RF signals into a digital data stream that is suitable for digital signal processing. Resistors and capacitors, for example, are commonly employed to implement cascaded RC filters in a deep sub-micron process associated with the wireless digital communications device. Such use of resistors and capacitors however, is disadvantageous in that resistor and capacitor values do not track each other accurately in a deep sub-micron process, making it extremely difficult if not impossible to accurately control the pole/filter characteristics.

In view of the above, it would be both desirable and advantageous to provide a technique for mixing and/or combining components in a deep sub-micron process that provides the same functionality as the cascaded RC filter, but which provides better tracking capability than the cascaded RC filter.

SUMMARY OF THE INVENTION

The present invention is directed to a technique of improving antialiasing and adjacent channel interference filtering using cascaded passive IIR filter stages combined with direct sampling and mixing. The technique avoids the shortcomings and disadvantages discussed herein before in association with a deep sub-micron process.

According to one embodiment, a sigma-delta analog-to-digital converter (ADC) comprises a loop filter followed by a comparator (e.g. multi-bit flash ADC) and a negative feedback that encloses the loop filter and comparator. The loop filter comprises a cascade of single pole IIR filters with or without an amplifier. The loop filter is suitable for use in a communications system receiver, transmitter, phase locked loop (PLL), and/or ADC, among others.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
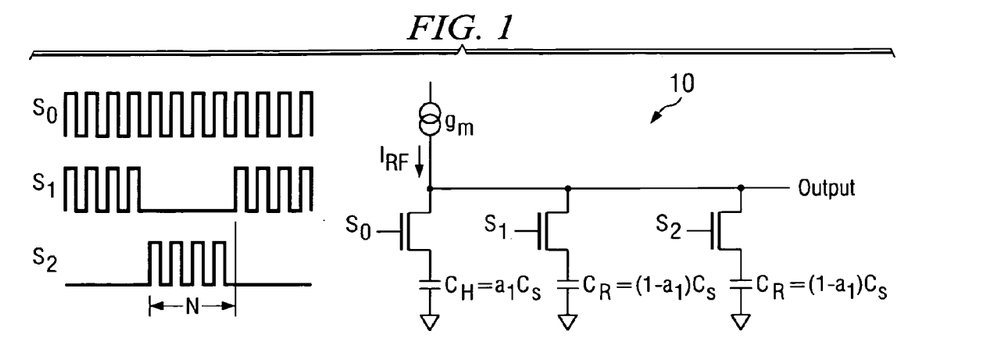
FIG. 1 is a schematic diagram illustrating a current-mode sampling mixer with recursive operation to provide infinite-impulse response (IIR) filtering.

FIG. 1 is a schematic diagram illustrating a current-mode sampling mixer 10 with recursive operation to provide infinite-impulse response filtering that is suitable for use in association with embodiments described herein. A detailed description of the sampling mixer shown in FIG. 1 is set forth by the present inventors in U.S. Pub. No. US 2003/0035499 A1, entitled Direct Radio Frequency (RF) Sampling With Recursive Filtering Method, published Feb. 20, 2003, and that is incorporated by reference in its entirety herein.

Figure 2:
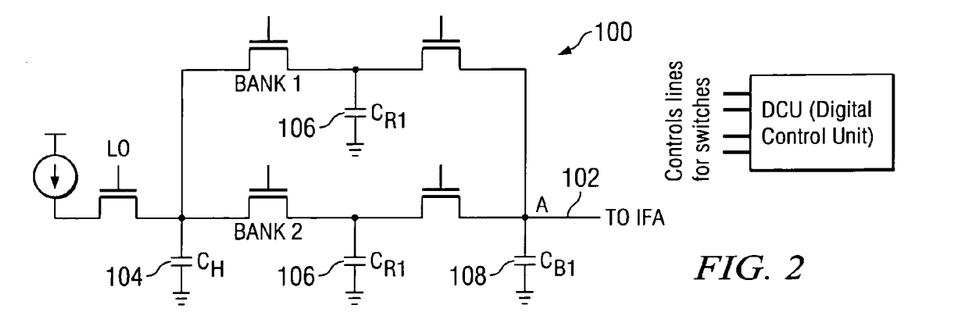
FIG. 2 is a simplified schematic diagram illustrating cascaded IIR filter stages in a MTDSM based Bluetooth receiver.

FIG. 2 is a simplified schematic diagram illustrating a cascaded IIR filter 100. In this solution, the IFA input signal is provided from the node A 102. One front-end solution was discovered by the present inventors to provide an overall filtering equivalent to a cascade of two first order IIR filtering stages (a one-pole IIR filter is unconditionally stable). The history capacitor ($C_H$) 104 is charged together with a rotating capacitor ($C_{R1}$) 106 in one bank for 32 periods of the RF waveform while the charge on the second bank is discharged to a buffer capacitor ($C_{B1}$) 108. In the next 32 rf periods, the bank holding this charge is discharged to ($C_{B1}$) 108 while the other bank which was discharged in the previous 32 cycles now collects new samples together with ($C_H$) 104. This creates the first order IIR filter whose pole is ideally selected by the ratio of ($C_{R1}$) 106 and ($C_H$) 104. In one Bluetooth receiver, $C_{R1}$ 106 is implemented as a collection of four capacitors each of which is connected to ($C_H$) 104 for only 8 rf periods. Test results indicated that the control of this pole was not dependent on this ratio alone; and that the output impedance of the LNTA plays an active role in determining this frequency.

The second stage of filtering is created when ($C_{R1}$) 106 is discharged to ($C_{B1}$) 108; passive charge sharing takes place and the total previously held charge on ($C_{B1}$) 108 and the new charge on ($C_{R1}$) 106 are shared between the two according to the ratio of these two capacitors. Since ($C_{B1}$) 108 is never discharged, it keeps a memory of all previous samples and performs the second stage of IIR filtering. The pole of this frequency can be tightly controlled by the ratio of ($C_{R1}$) 106 and ($C_{B1}$) 108; and the present inventors have achieved test measurements in a Bluetooth receiver front-end to verify this.

Quite clearly, the basic approach in developing a cascaded filter comprising a plurality of single-pole IIR filter stages is to create a unidirectional flow of information, signal, or charge and disallow any feedback from a later stage to an earlier stage. This is accomplished by completely discharging ($C_{R1}$) 106 before reusing it in the next "sampling cycle" with ($C_H$) 104. ($C_{R1}$) 106 is used as a charge transfer device which only transfers charge from the first stage output to the second stage input, and is reset before it is connected to the output of the first stage. This idea can now be extended to obtain further IIR filtering stages as explained herein below.

Figure 3:
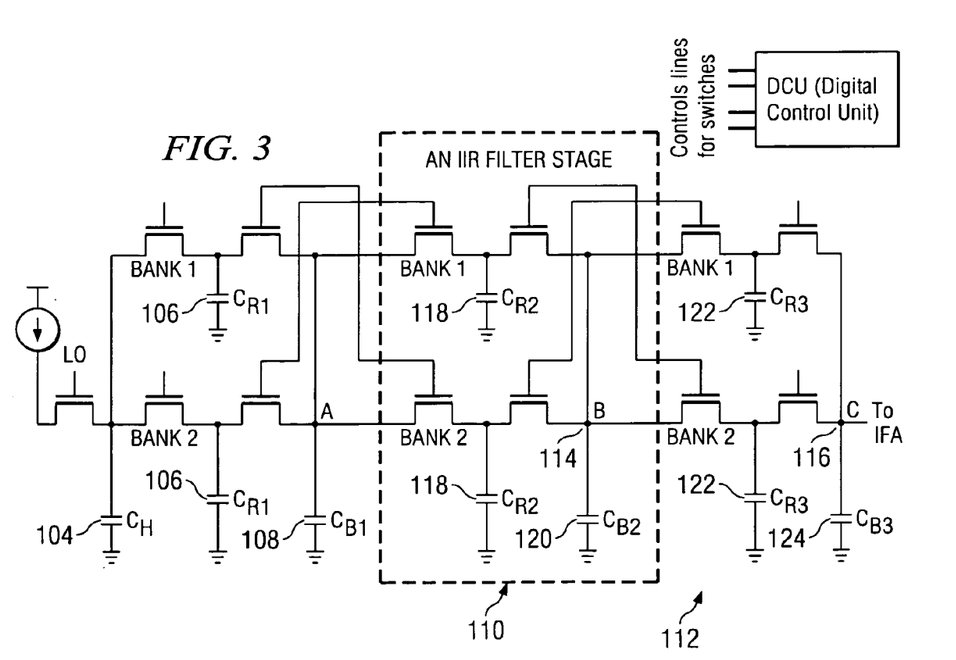
FIG. 3 is a schematic diagram illustrating cascaded IIR filter stages extended to a four stage passive IIR filter.

The basic idea of extending the single pole IIR filtering stages 100 is shown in FIG. 3. In this figure, two more stages of single-pole IIR filters 110, 112 are cascaded to the circuit 100 shown in FIG. 2. The output of the third stage 110 is at node B 114 and the output of the fourth stage 112 is at node C 116 which is now connected to the IFA input in place of node A 102.

The basic idea in the third stage 110 is to charge ($C_{R2}$) 118 together with ($C_{B1}$) 108, during the time when ($C_{R1}$) 106 is discharged to ($C_{B1}$) 108. While ($C_{R1}$) 106 carries the new information sample, ($C_{R2}$) 118 is initially discharged. ($C_{B1}$) 108 carries the previous history and is never discharged. The previous charge on ($C_{B1}$) 108 and the new charge on ($C_{R1}$) 106 is now split three ways into the new charge on ($C_{B1}$) 108, ($C_{R1}$) 106 and ($C_{R2}$) 118. The charge on ($C_{R1}$) 106 will be discarded as it will accumulate new samples together with ($C_H$) 104. ($C_{B1}$) 108 will retain the new charge for next operation cycle providing the IIR filtering. ($C_{R2}$) 118 will use its charge to transfer the filtered signal to the next buffer capacitor ($C_{B2}$) 120, in the next cycle of operation. During the time when one bank of ($C_{R2}$) 118 is collecting the new data, the other bank is charge sharing with ($C_{B2}$) 120, similar to the operation of the previous stage.

The same approach is extended to form another stage of IIR filtering 112 with ($C_{R3}$) 122 used to sample the charge together with ($C_{B2}$) 120 during the charge time while the other bank charge shares with the third buffer capacitor ($C_{B3}$) 124. A more complete analysis of the circuit depicted in FIG. 3 using charge transfer equations is provided herein below to further clarify the principles involved with using cascaded passive IIR filter stages.

Let $Q_{R1}(t)$ be the current input sample that is the charge on ($C_{R1}$) 106 when it charge shares with ($C_{B1}$) 108 and ($C_{R2}$) 118. Let $Q_{B1}(t)$ be the current charge on ($C_{B1}$) 108. ($C_{R2}$) 118 is always discharged before the new charge cycle; hence $Q_{R2}(t)=0$ After the charge sharing is completed, $$Q_{B1}(t+1)=\{Q_{B1}(t)+Q_{R1}(t)\}C_{B1}/(C_{B1}+C_{R1}+C_{R2})=\beta Q_{B1}(t)+\beta Q_{R1}(t) \quad (1)$$

where $\beta=C_{B1}/(C_{B1}+C_{R1}+C_{R2})$. Equation (1) demonstrates the IIR filter function performed on ($C_{B1}$) 108. The IIR equation in the charge domain can be written as $$y(n)=\beta y(n-1)+\beta x(n). \quad (2)$$

In voltage domain, the IIR equation becomes $$v_{B1}(n)=\beta v_{B1}(t)+\beta v_{R1}(t)C_{R1}/C_{B1} \quad (3)$$

which leads to $$V_{B1}(z)/V_{R1}(z)=\beta C_{R1}/(1-\beta)C_{B1} \quad (4)$$

The DC charge gain of the filter is $\beta/(1-\beta)$, while the DC voltage gain is $C_{R1}/C_{B1}$ times the charge gain, or $C_{R1}/(C_{R1}+C_{R2})$. The above equation shows that the filter has a gain less than 1 in this configuration.

The new charge sample on $C_{R2}$ is given as $$Q_{R2}(t+1)=\{Q_{B1}(t)+Q_{R1}(t)\}C_{R2}/(C_{B1}+C_{R1}+C_{R2}) \quad (5)$$

The DC voltage gain at the output of $C_{R2}$ remains the same as before, i.e. $C_{R1}/(C_{R1}+C_{R2})$ which is a measure of the attenuation in the filter.

The equation for the next output stage is given as $$Q_{B2}(t+1)=\{Q_{B2}(t)+Q_{R1}(t)\}C_{R2}/(C_{B2}+C_{R2}+C_{R3})=\alpha Q_{B1}(t)+\alpha Q_{R1}(t) \quad (6)$$

where $\alpha=C_{B2}/(C_{B2}+C_{R2}+C_{R3})$. This forms the second IIR Filter stage with the pole location determined by $\alpha$.

The net voltage gain at DC is then $C_{R1}/(C_{R1}+C_{R2})*C_{R2}/(C_{R2}+C_{R3})$. The attenuation can thus be traded off with capacitor ratios. To keep attenuation small $C_{R1} \gg C_{R2} \gg C_{R3}$. The present inventors anticipate that noise will probably place restrictions on the minimum acceptable size of $C_{R3}$. Thus, a trade-off between noise of the filter, capacitor size and attenuation (which is related to noise referred from the remainder of the receiver circuit) can be established.

The present inventors noticed that for the second IIR filter stage 110, discharging $C_{R2}$ every cycle destroys charge held by the system comprising $C_{R1}$, $C_{B1}$ and $C_{R2}$. This effect is also present at the final output 116 of the filtering stages which is connected to the IFA input. If the IFA provides a high input capacitance which is discharged every clock cycle, a part of the charge on the last buffer capacitor will also be destroyed leading to a reduction in gain. This requires that the IFA input capacitance must either be kept small in comparison to the final output buffer capacitor, or it must not be discharged from cycle to cycle.

The above analysis was discovered by the present inventors to apply only to a system of cascaded filters in which charge is destroyed on the rotating capacitor before it takes the new input sample. A loss of 2 dB has been reported in the prior art due to the addition of one PIIR stage. In one known scheme, the charge on the rotating capacitor is not reset after the capacitor charge shares with the buffer capacitor on the following stage and before it obtains a new sample from the preceding stage. In this case, no loss in gain was seen due to addition of PIIR stages.

Figure 4A:
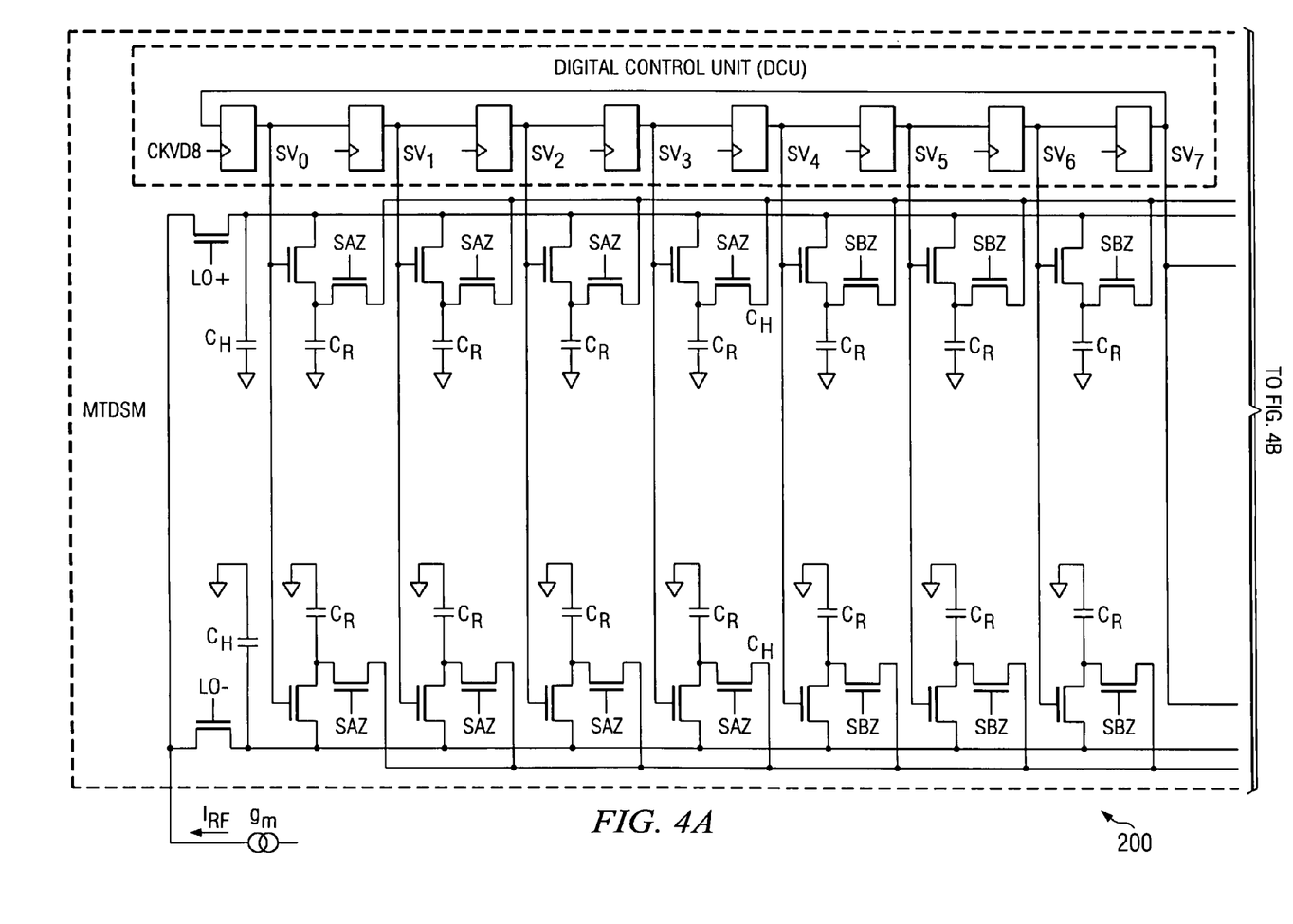
FIG. 4 is a schematic diagram illustrating a Bluetooth receiver multi-tap direct sampling mixer modified with recursive passive IIR (PIIR) filtering according to one embodiment of the present invention.
Figure 4B:
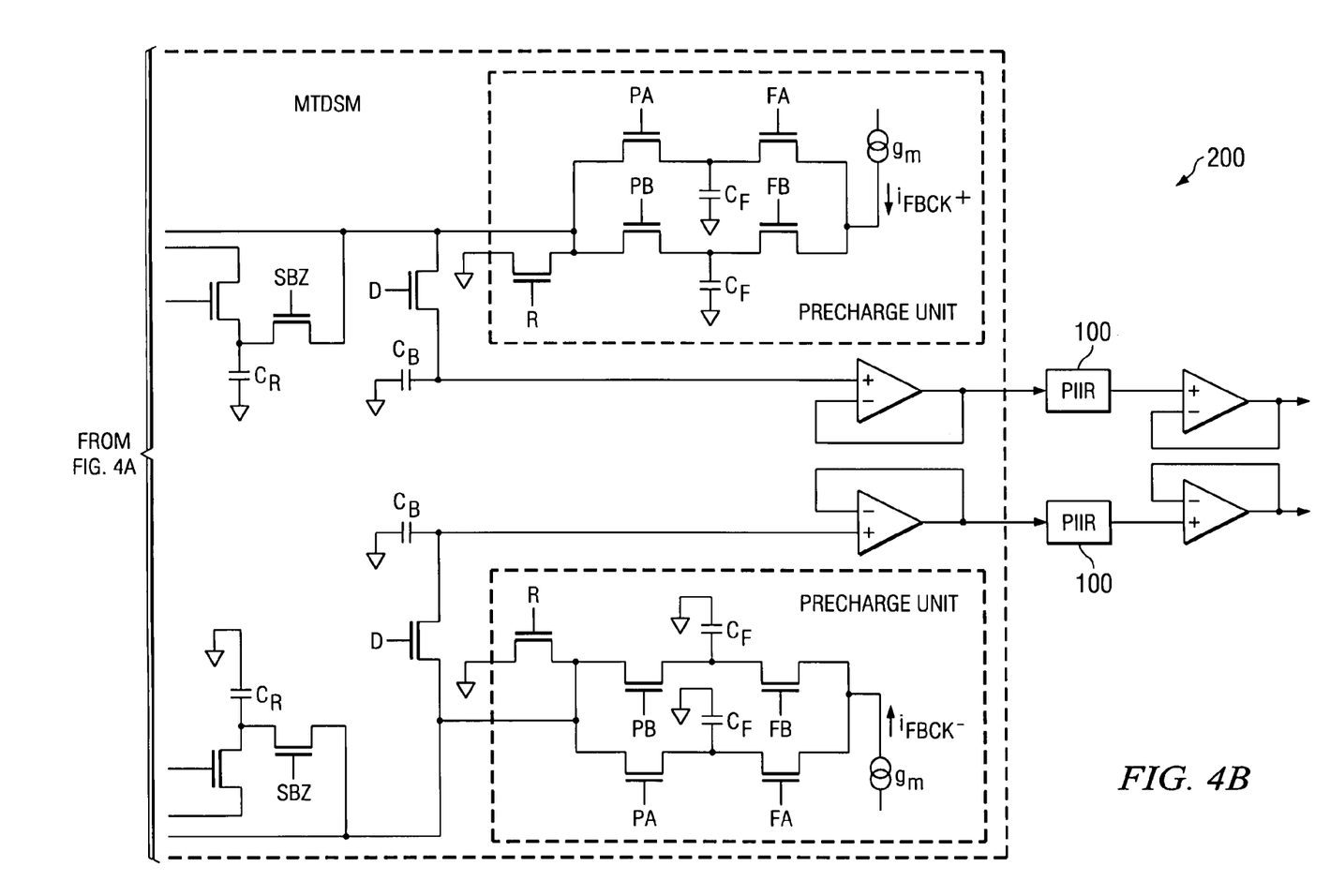

FIG. 4 is a schematic diagram illustrating a Bluetooth receiver MTDSM 200 modified with recursive filter (PIIR)

stages according to one embodiment of the present invention. One or two IIR stages 100 are added following the MTDSM and are labeled as PIIR (passive IIR) filter stage. The timing details are described herein below with reference to FIG. 5 for a single stage of IIR filter in the MTDSM 200.

The PIIR function is a single IIR stage 100 that follows the second IIR stage in the MTDSM 200. In reality, the two base-band passive IIR filters 100 most preferably should collectively be considered as the PIIR block. This nomenclature is due to historic reasons associated with a Bluetooth receiver front-end as it evolved from a non-recursive down-converter and down sampler to a multi-stage recursive IIR filter implementation. The present inventors noticed that all the required signals for the added IIR stage 100 are already available in the present receiver. The only addition required to add another pole was discovered by the present inventors to provide three capacitors and a few switches. The size of the three capacitors is similar to $C_R$ and $C_B$.

To further clarify the embodiments described herein, the scenario when the rotating capacitor (C.sub.R2) is not reset before it collects the new sample and deduces that there is no loss of gain in the front-end since no charge is discarded from the system, is now discussed herein below with reference to FIG. 6. In the present inventors' experience with a discrete time analog design approach of constructing an rf front-end, the idea of some-how preserving the charge in constructing various functions has always led to a more efficient design in some form. One example of such a construct employs a power efficient charge transfer scheme that employs single pole IIR analog filters. Using this approach proves again to be of use as is described herein below.

In this power efficient charge transfer scheme, CTL_P is always 0, which means that $(C_{R2})$ now transfers charge not only from $(C_{B2})$ to $(C_{B1})$, but also from $(C_{B1})$ to $(C_{B2})$, and provides a feedback signal to the earlier stage from the later stage. A direct consequence of this scheme is that no charge is lost due to preset, and the main reason for loss of gain is eliminated.

The present inventors discovered that leaving the CTL_P can be used to reduce the front-end gain in a manner that provides a very simple gain step mechanism without incurring a significant power dissipation or area overhead. Further, this scheme was found to guarantee monotonic gain steps when multiple such stages are cascaded.

Figure 6:
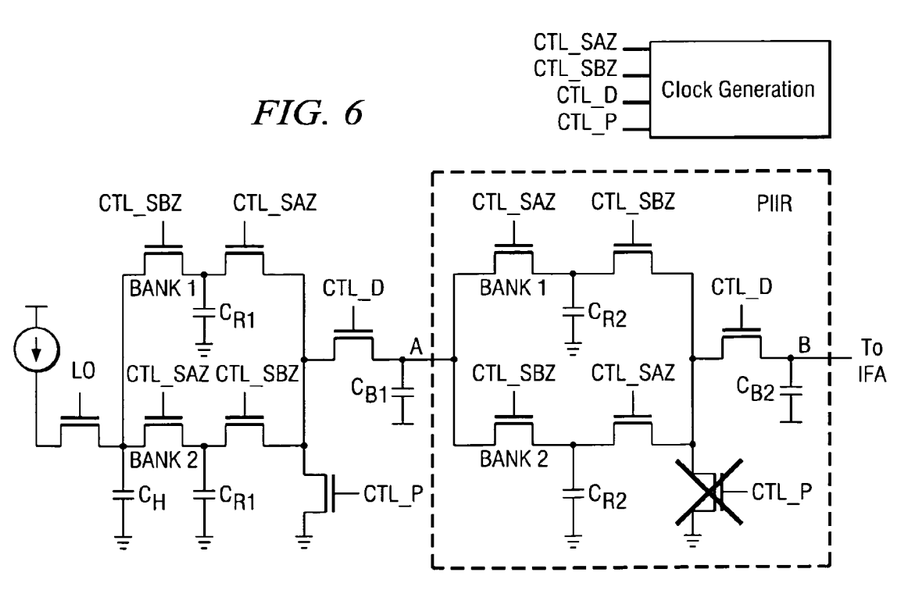
FIG. 6 shows the circuit depicted in FIG. 4 but with the rotating capacitor not precharged.

With continued reference now to FIG. 6, when a new sample arrives on $C_{R1}$, a new sample $Q_{R1}(t)$ leads to $$Q_{B1}(t)=\{Q_{B1}(t-1)+Q_{R1}(t)+Q_{R2}(t-1)\}C_{B1}/(C_{B1}+C_{R1}+C_{R2}), \text{ and} \quad (7)$$

$$Q_{R2}(t)=\{Q_{B1}(t-1)+Q_{R1}(t)+Q_{R2}(t-1)\}C_{R2}/(C_{B1}+C_{R1}+C_{R2}). \quad (8)$$

In the next stage, $$Q_{B2}(t)=\{Q_{B2}(t-1)+Q_{R2}(t)\}C_{B2}/(C_{B2}+C_{R2}) \quad (9)$$

The above equation (9) leads to $$Q_{B2}/Q_{R2}(z)=\rho/(1-\rho z^{-1}) \quad (10)$$

where $$\rho=C_{B2}/(C_{B2}+C_{R2}). \quad (11)$$

This then leads to $$v_{B2}/v_{R2}(z)=C_{R2}/C_{B2}\rho/(1-\rho z^{-1}) \quad (12)$$

This equation (12) indicates the dc gain of the second stage is 1. This is only true if there is no removal of charge from $C_{B2}$ as is considered in these equations. It does not matter that the new sample is brought to this system by a different physical capacitor.

Capacitor $C_{R2}$ takes a snap shot of the action of $C_{B1}$ while presenting a snap shot of the previous action that took place on $C_{B2}$. At the same time, a different physical $C_{R2}$ presents to $C_{B2}$ a snap shot of the previous action on $C_{B1}$, while anticipating taking a snap shot of the new action on $C_{B2}$.

Hence, noticing the function of $C_{R2}$, the equations now become very tractable. In the following discussion, β is defined by $\beta=C_{B1}/(C_{B1}+C_{R1}+C_{R2})$ and λ is defined by $\lambda=C_{B2}/(C_{B2}+C_{R2})$. It is easier to look at the equations in the z-domain so that equations (7) and (9) are re-written as $$Q_{B1}(z)=\{z^{-1}Q_{B1}(z)+Q_{R1}(z)+z^{-1}Q_{R2}(z)\}\beta \quad (13)$$

$$Q_{B2}(z)=\{z^{-1}Q_{B2}(z)+Q_{R2}(z)\}\lambda. \quad (14)$$

Next, in view of the foregoing observations, equation (13) is modified as $$Q_{B1}(z)=\{z^{-1}Q_{B1}(z)+Q_{R1}(z)+z^{-1}Q_{B2}(z)C_{R2}/C_{B2}\}\beta. \quad (15)$$

Similarly equation (14) becomes $$Q_{B2}(z)=\{z^{-1}Q_{B2}(z)+z^{-1}Q_{B1}(z)C_{R2}/C_{B1}\}\lambda. \quad (16)$$

The last two equations (15) and (16) are enough to understand the behavior of this system. The last equation (16) gives $$Q_{B2}(z)\{1-\lambda z^{-1}\}=z^{-1}Q_{B1}(z)\lambda C_{R2}/C_{B1}, \quad (17)$$

which leads to $$Q_{B2}(z)=Q_{B1}(z)z^{-1}\lambda C_{R2}/C_{B1}\{1-\lambda z^{-1}\}, \quad (18)$$

and this is substituted in equation (15) to get $$Q_{B1}(z)(1-\beta z^{-1})=\beta Q_{R1}(z)+z^{-1}Q_{B1}(z)[z^{-1}\lambda\beta C_{R2}^2/C_{B1}C_{B2}\{1-\lambda z^{-1}\}] \quad (19)$$

$$Q_{B1}(z)C_{B1}C_{B2}\{1-\lambda z^{-1}\}\{1-\beta z^{-1}\}=\beta C_{B1}C_{B2}\{1-\lambda z^{-1}\}Q_{R1}(z)+z^{-2}Q_{B1}(z)\lambda \quad (20)$$

$$Q_{B1}(z)[C_{B1}C_{B2}\{1-\lambda z^{-1}\}\{1-\beta z^{-1}\}-z^{-2}\lambda\beta C_{R2}^2]=\beta C_{B1}C_{B2}\{1-\lambda z^{-1}\}Q_{R1}(z) \quad (21)$$

which finally leads to $$Q_{B1}(z)/Q_{R1}(z)=\beta C_{B1}C_{B2}\{1-\lambda z^{-1}\}/[C_{B1}C_{B2}\{1-\lambda z^{-1}\}\{1-\beta z^{-1}\}-z^{-2}\lambda\beta C_{R2}^2] \quad (22)$$

as the transfer function of the first stage. The dc gain of this stage is given as $\beta C_{B1}C_{B2}\{1-\lambda\}/[C_{B1}C_{B2}\{1-\lambda\}\{1-\beta\}-\lambda\beta C_{R2}^2]$, which after some manipulation leads to $$Q_{B1}(z)/Q_{R1}(z)|_{z=e^{j0}}=C_{B1}/C_{R1}, \quad (23)$$

and the voltage gain at dc is given as $$v_{B1}(z)/v_{R1}(z)|_{z=e^{j0}}=C_{B1}/C_{R1}*C_{R1}/C_{B1}=1. \quad (24)$$

Figure 7:
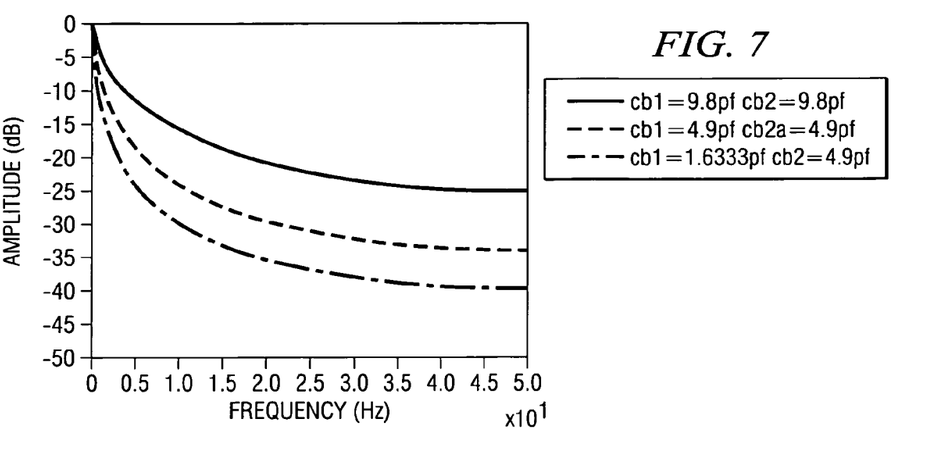
FIG. 7 is a graph showing gain plots associated with a single PIIR filter for a desired range of charge transfer capacitors.
Figure 8:
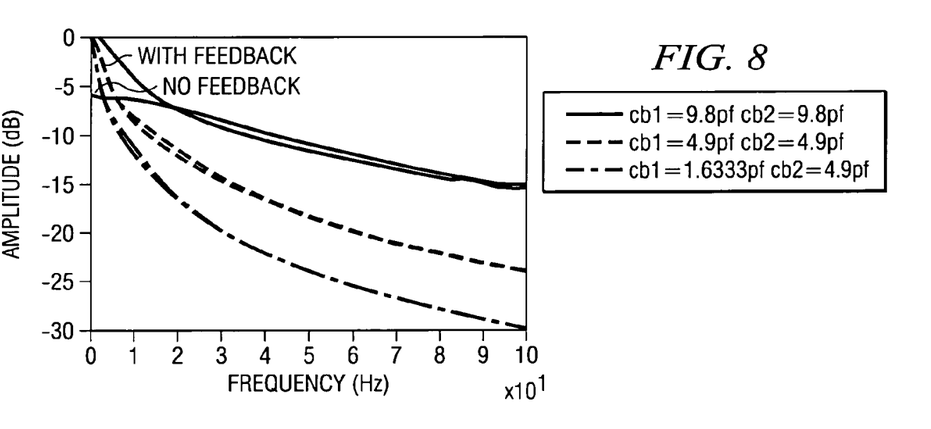
FIG. 8 is a graph showing gain plots associated with a single PIIR filter for another range of charge transfer capacitors.

The resulting filter is therefore not a simple one-pole filter any more as the reader must have suspected by now. It has a frequency response given by equation (22). It is believed that the resulting filter is unconditionally stable due to its passive nature and weak feed-back. The response of this filter is shown in FIGS. 7 and 8 when using a spice simulation. The charge domain equation simplifies to $$Q_{B1}(z)/Q_{R1}(z)=(\beta-\lambda z^{-1})/[1-(\lambda+\beta)z^{-1}+\lambda\beta\{1-C_{R2}^2/C_{B1}C_{B2}\}z^{-2}] \quad (25)$$

which can be viewed in discrete time as $$y(n)-(\lambda+\beta)y(n-1)+\lambda\beta\{1-C_{R2}^2/C_{B1}C_{B2}\}y(n-2)=\beta x(n)-\lambda x(n-1), \quad (26)$$

while the voltage domain filter equation can be expressed as $$v_y(n) - (\lambda + \beta)v_y(n-1) + \lambda\beta\{1 - C_{R2}^2/C_{B1}C_{B2}\}v_y(n-2) = \qquad (27)$$
$$(\beta C_{R1}/C_{B1})v_x(n) - (\lambda C_{R1}/C_{B1})v_x(n-1).$$

Although this filter is ideally lossless, it should be noted the effects of switch resistance and parasitic capacitances have not been modeled. Those skilled in the art can appreciate that it is very likely there will be some loss (although simulations in spice have not shown any appreciable loss without back annotated parasitics, and that arbitrary cascading of such stages will be limited by non idealities. In view of the foregoing analysis however, the present inventors believe this scheme shows great promise in construction of very low-power highly selective Bluetooth receiver front end.

The stability of the IIR filter described herein above with reference to FIGS. 5-8 can now be shown by first noting that the characteristic equation from equation (26) can be observed to be $$\mu^2 - (\lambda + \beta)\mu + \lambda\beta\{1 - C_{R2}^2/C_{B1}C_{B2}\} = 0 \qquad (28)$$
$$\mu = 0.5\{(\lambda + \beta) \pm sqrt[(\lambda + \beta)^2 - 4\lambda\beta\{1 - C_{R2}^2/C_{B1}C_{B2}\}]\} =$$
$$0.5\{(\lambda + \beta) \pm sqrt[\lambda^2 + \beta^2 - 2\lambda\beta + 4\lambda\beta C_{R2}^2/C_{B1}C_{B2}]\}$$
$$= 0.5\{(\lambda + \beta) \pm sqrt[(\lambda - \beta)^2 + 4\lambda\beta C_{R2}^2/C_{B1}C_{B2}]\}. \qquad (29)$$

Figure 9A:
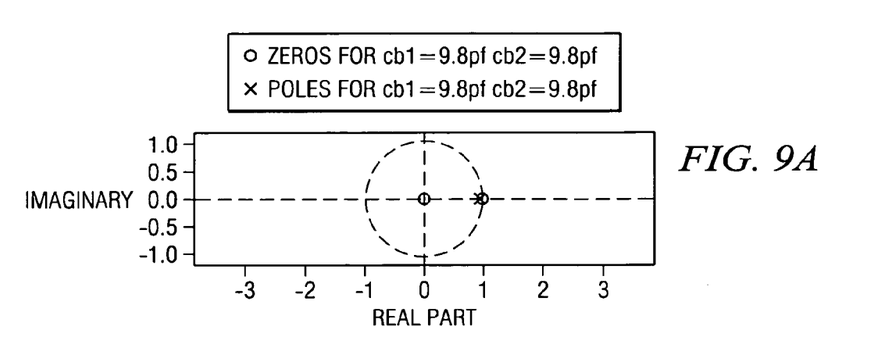
FIG. 9 is a set of graphs showing pole zero plots for a single PIIR filter corresponding to various filter capacitor ratios.
Figure 9B:
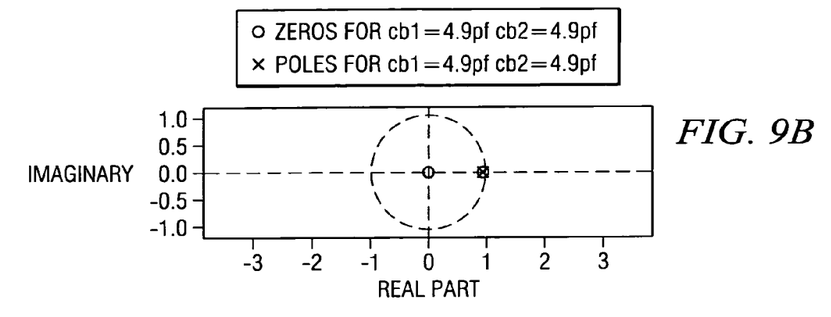
Figure 9C:
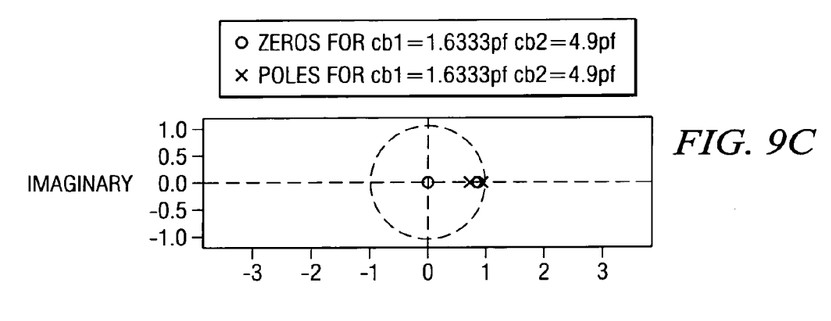

The quantity inside the sqrt is positive; therefore the above equation (28) can only have positive roots. These roots are the poles of the PIIR filter; and they lie on the real axis for all values of $\lambda$ and $\beta$. Hence, the response of this filter is critically damped and does not reveal any oscillations. This is also intuitively clear as the filter is passive in nature and is incapable of oscillating on its own. This is confirmed by the plots shown in FIG. 9 which correspond to various capacitor ratios and show that the roots of the polynomial lie on the real-axis.

Figure 10:
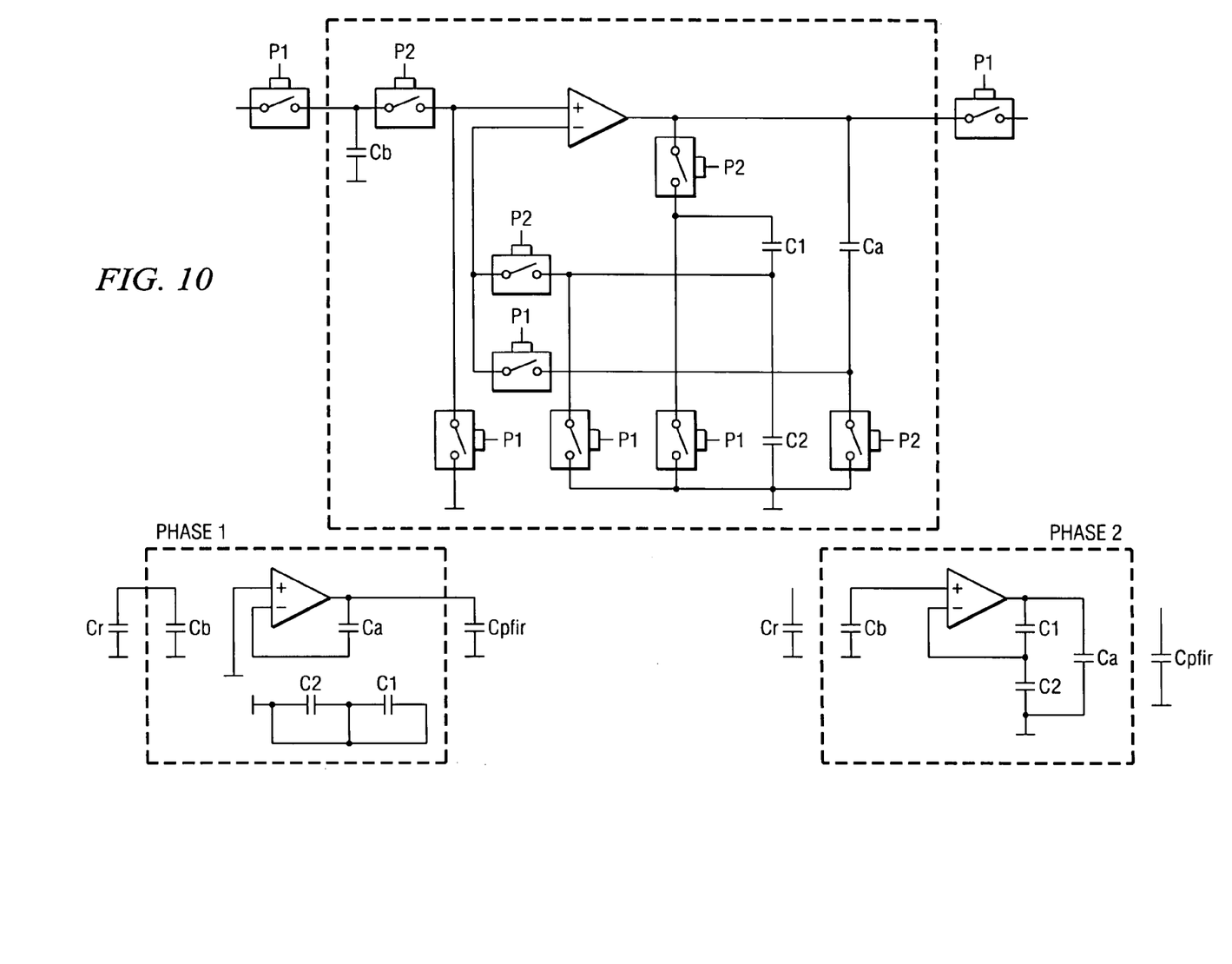
FIG. 10 is a schematic diagram illustrating an intermediate frequency amplifier (IFA) portion of a Bluetooth receiver.
Figure 11:
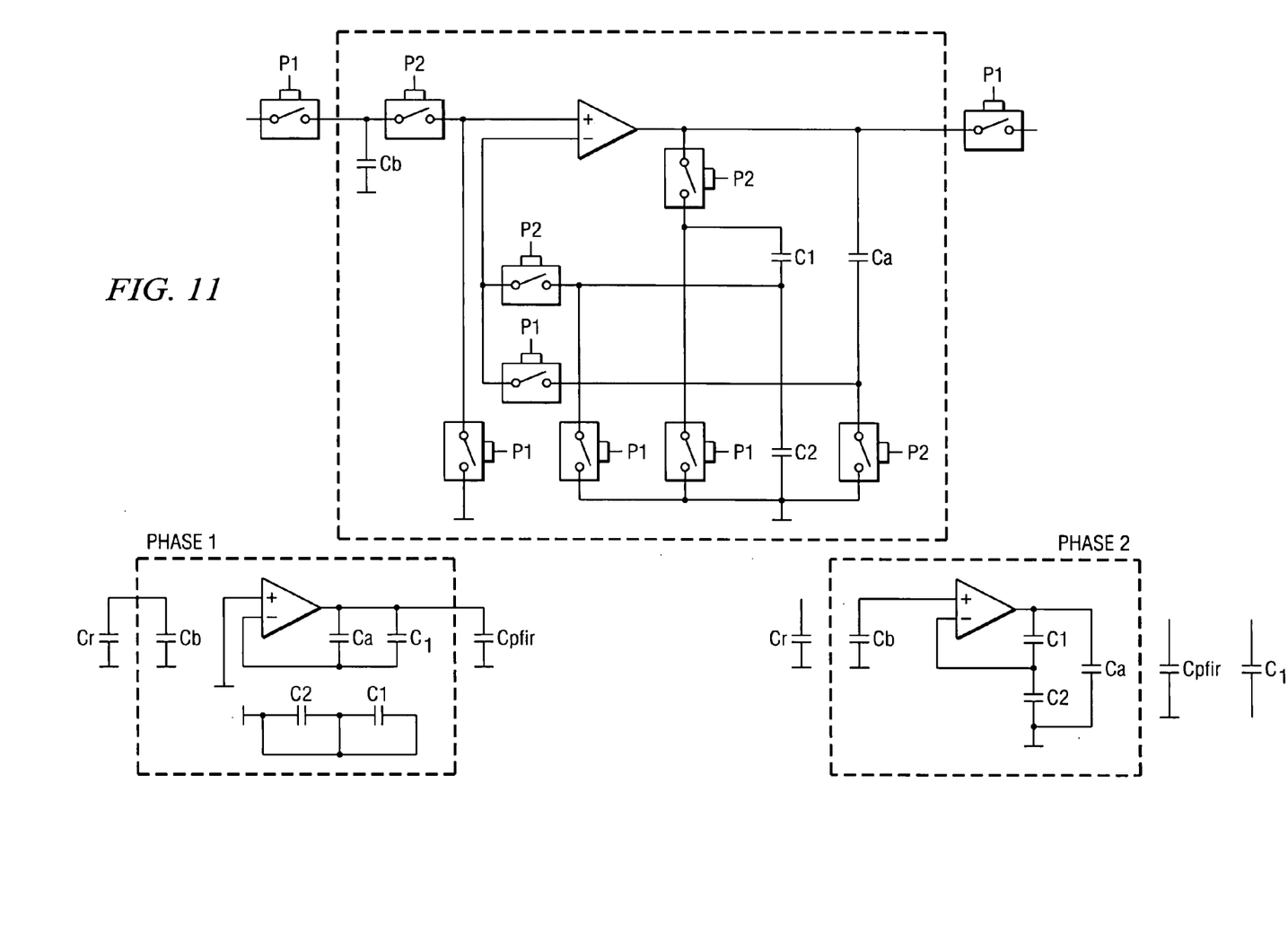
FIG. 11 is a schematic diagram illustrating the IFA shown in FIG. 10, modified with a one-pole IIR filter according to one embodiment of the present invention.

The PIIR concepts described herein before with reference to the different embodiments, can also be extended to the Bluetooth receiver IFA by adding a memory capacitor to the feedback of the IFA. In this regard, FIG. 10 shows the architecture of the original IFA which provides a gain to the input signal; while the modified IFA is shown in FIG. 11. The idea is to build up the charge on $C_a$, as in the original design shown in FIG. 10 during phase 2; however, use another memory capacitor $C_1$ in phase I to passively filter the built-up signal while the amplifier drives $C_{pfir}$ to charge to the output of the IFA. Capacitor $C_1$ is never discharged and accepts new input data from $C_a$ during the time when $C_{pfir}$ is also to be charged up to the output of the PIIR. Since the filtering occurs passively, the voltage on $C_{pfir}$ follows the output of $C_a$ in parallel with $C_1$. The pole frequency is determined by the ratio of $C_a$ to $C_1$.

Regarding the scheme described herein above with reference to FIGS. 10 and 11, the new IFA can be viewed as a cascade of two stages, the first one being the original IFA shown in FIG. 10, and the second one being a single pole PIIR filter. The procedure is to use the IFA to drive the $C_{pfir}$ while taking the signal from the PIIR filter. The pole position is strictly determined by the ratio of two capacitors. No extra timing signals are required.

The main advantage of the foregoing scheme is the low power implementation in which little modification is required to the existing Bluetooth receiver design. A disadvantage of the foregoing scheme is that passive filters do not provide gain, but rather have a loss. This loss is not immediately recognized since if one looks at the IIR charge transfer equations, they predict unity gain. However, the parasitic capacitances hanging off the buffer capacitors create this loss. Furthermore, passive filters are also susceptible to clock noise. Despite these disadvantages, measurements by the present inventors have shown that these issues are not a bottleneck, but an important consideration in the system level design.

The PIIR filter implemented in the above IIR filter was verified by the present inventors using simulations, to incur a loss of 2 dB due to the charge on $C_a$ being destroyed in every cycle. This loss can be recovered by resizing the capacitors in the IFA to provide additional gain of 2 dB. The primary advantage of this scheme is that it consumes very little power while providing a tightly controllable filter pole location prior to the associated A/D conversion. By now, the attenuation is large enough such that no anti-aliasing filter is required in the following A/D converter. Hence, PFIR becomes redundant and may be removed to reduce area.

Figure 5:
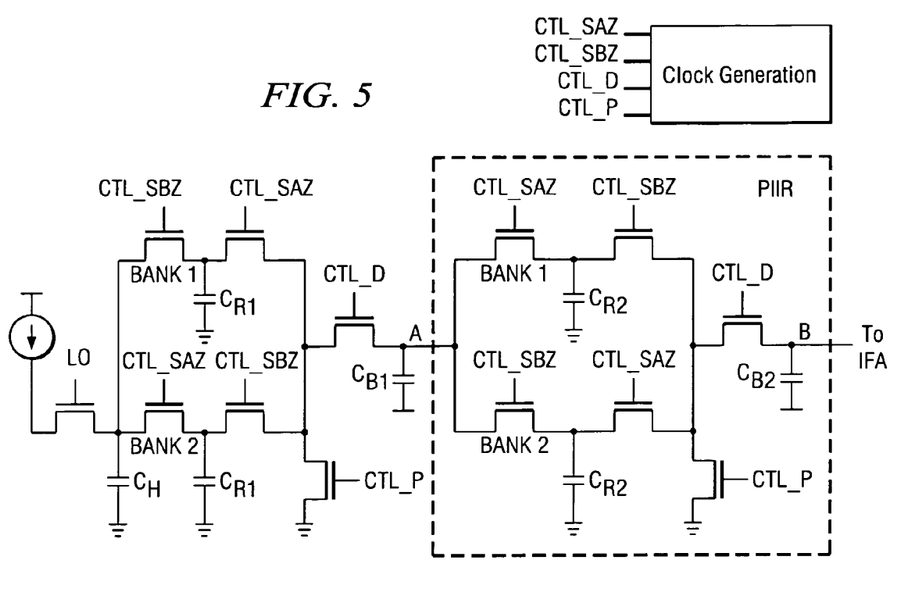
FIG. 5 is a schematic diagram suitable for describing timing characteristics associated with a single IIR stage (PIIR) added to the Bluetooth receiver MTDSM shown in FIG. 3.
Figure 12:
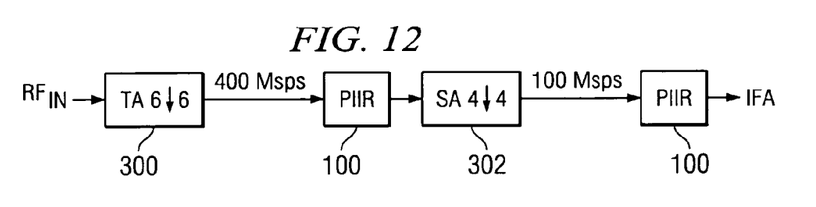
FIG. 12 is a block diagram showing a front-end architecture associated with a Bluetooth receiver.

FIG. 12 is a block diagram showing a front-end architecture associated with one existing Bluetooth receiver. The first accumulation stage 300 comprises $C_H$ 104 and $C_R$ 106 that decimates the data rate to approximately 400 Msps which determines $f_s$ as well as the absolute frequency of the location of the pole. In this approach, single zeros are placed on the aliasing frequencies in the first stage of decimation 300 which is shown as a time or temporal averaging (TA) filter. The only other protection from signals at these frequencies is the antenna filter (in case it does not jump the antenna filter in the implementation). The PIIR filter 100 poles apply to absolute frequencies determined by fs=400 Msps; and the filter 100 is comprised of a single stage one-pole IIR filter such as seen in FIG. 2. The spatial averaging (SA) filter 302, implemented by charge sharing the four rotating capacitors such as depicted in FIG. 5, on read out, further decimates the data rate by another factor of 4 providing a single zero to the new aliasing frequencies. The preceding PIIR however helps in the rejection of these frequencies.

Figure 13:
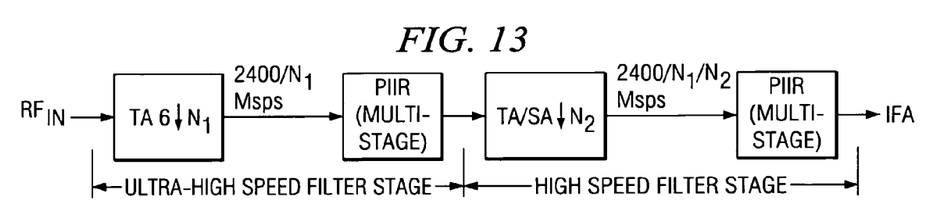
FIG. 13 is a block diagram showing the front-end architecture depicted in FIG. 12 modified according to one embodiment of the present invention.

FIG. 13 shows an improved implementation in which the decimation is performed by a factor of $N_1$ to provide data at a rate of 2400/$N_1$ Msps. The multi-stage passive IIR filter can be used to provide one or two stages of single-pole IIR filters, such as seen in FIG. 3, running at the ultra-high speed and providing significant rejection to adjacent and far-away interferers. The only vulnerability in this approach relates to aliasing frequencies that arise from the first decimation stage in like fashion using the existing front-end architecture discussed herein before. By reducing $N_1$ however, the number of such frequencies can be reduced and pushed further away from the baseband frequencies.

The PIIR filter also provides anti-aliasing filtering to the subsequent stage which can either use spatial or temporal averaging. This brings down the data rate to one which can be easily handled by the IFA while providing one-zero to the folding over frequencies. A multi-stage PIIR filter may be used at the input of the IFA to provide further rejection at this point.

The PIIR filter may also be used at the output of the IFA and can effectively eliminate the need for PFIR since most of the interferer energy is already removed. This scheme was found by the present inventors to provide significantly more selectivity without incurring the overhead of significant extra power dissipation or amplifier design.

In summary explanation, improvements to an existing Bluetooth receiver front-end provide enhanced selectivity without incurring significant power dissipation overhead or a major re-design. These inventive architectures can be employed in the Bluetooth receiver for obtaining the selectivity required by the GSM specification.

Figure 14:
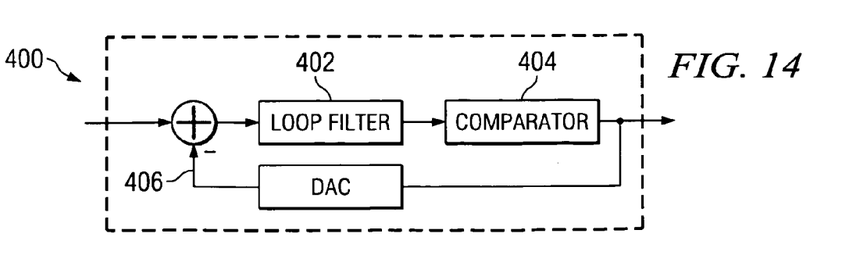
FIG. 14 is a simplified block diagram illustrating a sigma-delta ADC according to one embodiment of the present invention.

Looking now at FIG. 14, a simplified block diagram illustrates a sigma-delta ADC 400 according to one embodiment of the present invention. Sigma-delta analog-to-digital converter (ADC) 400 comprises a loop filter 402 followed by a comparator (e.g. multi-bit flash ADC) 404 and a negative feedback 406 that encloses the loop filter 402 and comparator 404. The loop filter 402 comprises a cascade of single pole IIR filters with or without an amplifier as described in detail herein before. The loop filter 402 is suitable for use in a communications system receiver, transmitter, phase locked loop (PLL), and/or ADC, among others. Further, the loop filter 402 avoids the shortcomings and disadvantages generally associated with resistor-capacitor filters in a deep submicron process.

In view of the above, it can be seen the present invention presents a significant advancement in the art of discrete time RF filtering. Further, this invention has been described in considerable detail in order to provide those skilled in the art of antialiasing and adjacent channel interference filtering for GSM and related applications, with the information need to apply the novel principles and to construct and use such specialized components as are required. It should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. A discrete time analog filter comprising a cascade of single pole analog IIR filters configured to generate an output signal in response to an input signal.

2. The discrete time analog filter according to claim 1, further comprising means for direct sampling, wherein the cascade of single pole IIR filters and means for direct sampling together implement a high order filter devoid of amplifiers.

3. The discrete time analog filter according to claim 1, wherein the cascade of single pole IIR filters together implement a high order filter devoid of amplifiers.

4. The discrete time analog filter according to claim 1, wherein the cascade of single pole IIR filters is operational to create a uni-directional flow of information, signal, or charge and disallow any feedback from a later filter stage to an earlier filter stage.

5. A discrete time analog filter comprising:
a cascade of single pole analog IIR filters configured to generate an output signal in response to an input signal; and
a multi-tap direct sampling mixer, wherein the cascade of single pole IIR filters and multi-tap direct sampling mixer together implement a high order filter devoid of amplifiers.

6. A discrete time analog filter comprising:
a cascade of single pole analog IIR filters configured to generate an output signal in response to an input signal, wherein the cascade of single pole IIR filters together implement a high order filter devoid of amplifiers, and comprises a history capacitor that is charged together with a first rotating capacitor in a first capacitor bank for a predetermined time period while a charge in a second capacitor bank is charge shared with a buffer capacitor and a second rotating capacitor, and wherein during a subsequent time period, the first capacitor bank holding its charge is charge shared with the buffer capacitor while the second capacitor bank which was charge shared in a previous time period now collects new samples together with the history capacitor.

7. The discrete time analog filter according to claim 6, wherein the charge on the second rotating capacitor is reset only after it charge shares with the buffer capacitor on the following stage and before it obtains a new sample from the preceding stage.

8. A discrete time analog filter comprising:
a cascade of single pole analog IIR filters configured to generate an output signal in response to an input signal;
a comparator responsive to the filter output signal to generate an output signal there from; and
a negative feedback loop enclosing the cascade of single pole IIR filters and the comparator such that the input signal consists of an RF input signal combined with a negative feedback signal flowing in the negative feedback loop.

9. The discrete analog filter according to claim 8, wherein the cascade of single pole IIR filters together operate as a loop filter inside a sigma delta loop.

10. The discrete analog filter according to claim 8, wherein the input signal consists of an RF input signal minus a negative feedback signal flowing in the negative feedback loop.

11. The discrete analog filter according to claim 8, wherein the comparator comprises an ADC.

12. The discrete analog filter according to claim 11, wherein the ADC comprises a multi-bit flash ADC.

13. The discrete analog filter according to claim 8, wherein the negative feedback loop comprises a digital-to-analog converter (DAC).

14. A receiver front-end comprising a cascade of single pole IIR analog filters configured to generate an output signal in response to an input signal.

15. A receiver front-end comprising:
a cascade of single pole IIR analog filters configured to generate an output signal in response to an input signal; and
a means for direct sampling, wherein the cascade of single pole IIR filters and means for direct sampling together implement a high order filter devoid of amplifiers.

16. A receiver front-end comprising:
a cascade of single pole analog IIR filters configured to generate an output signal in response to an input signal; and
a multi-tap direct sampling mixer, wherein the cascade of single pole IIR filters and multi-tap direct sampling mixer together implement a high order filter devoid of amplifiers.

* * * * *